(12) United States Patent
Lim

(10) Patent No.: US 6,721,218 B2
(45) Date of Patent: Apr. 13, 2004

(54) SEMICONDUCTOR MEMORY DEVICE AND DATA READ METHOD THEREOF

(75) Inventor: Kyu-Nam Lim, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/075,472

(22) Filed: Feb. 13, 2002

(65) Prior Publication Data

US 2002/0118577 A1 Aug. 29, 2002

(30) Foreign Application Priority Data

Feb. 23, 2001 (KR) .......................................... 2001-9340

(51) Int. Cl.[7] ................................................. G11C 7/02
(52) U.S. Cl. ...................... 365/205; 365/207; 365/202; 327/51; 327/52
(58) Field of Search .................... 365/205, 202, 365/207; 327/51, 52

(56) References Cited

U.S. PATENT DOCUMENTS

| | | | |
|---|---|---|---|
| 5,144,171 A | * | 9/1992 | Huard |
| 5,504,443 A | * | 4/1996 | Gross et al. |
| 5,525,917 A | * | 6/1996 | Wong et al. |
| 5,525,919 A | * | 6/1996 | Phelan |
| 5,850,365 A | * | 12/1998 | Reese et al. |
| 5,926,057 A | * | 7/1999 | Ogawa |
| 6,359,808 B1 | * | 3/2002 | Chen et al. |

* cited by examiner

*Primary Examiner*—Viet Q. Nguyen
(74) *Attorney, Agent, or Firm*—Marger Johnson & McCollom, P.C.

(57) ABSTRACT

A device according to the invention includes memory cells and a current sense amplifier. It also includes a feedback circuit to adjust a gain of the current sense amplifier. The gain is adjusted depending on relative delays of data stored in different ones of the memory cells to be read on the current sense amplifier.

16 Claims, 8 Drawing Sheets

SEMICONDUCTOR MEMORY DEVICE AND DATA READ METHOD THEREOF

CROSS REFERENCE TO OTHER APPLICATIONS

This application claims the benefit of Korean Patent Application No. 2001-9340, filed on Feb. 23, 2001, under 35 U.S.C. §119, the entirety of which is hereby incorporated by reference.

BACKGROUND OF THE INVENTION

1. Field of the Invention

The present invention relates to a semiconductor memory device, and more particularly, to a data read method of the semiconductor memory device.

2. Description of Related Art

In a typical semiconductor memory device, different memory cells have different path lengths to a current sense amplifier. The different path lengths result in a difference of the speed of reading. At its worst, the difference is the largest between data read from memory cell farthest from the current sense amplifier and data read from the memory cell nearest to the current sense amplifier.

FIG. 1 is a block diagram illustrating a conventional semiconductor memory device. The semiconductor memory device includes a plurality of memory cell arrays 10-1 to 10-8. Each of the memory cell arrays 10-1 to 10-8 includes a plurality of memory cells MC1 and MC1B to MC4 and MC4B near a crossing point of a plurality of word lines WL1 to WLm and a plurality of bit line pairs BL1P to BL4P.

The bit line pairs BL1P to BL4P are connected to sense amplifiers 12-1 to 12-4, data IO gates IOG1 to IOG4, bit line isolation gates ISG1 to ISG4, and pre-charge circuits PRE1 to PRE4, respectively.

Each of the data IO gates IOG1 to IOG4 includes NMOS transistors N1 and N2. Each of the bit line isolation gates ISG1 to ISG4 includes NMOS transistors N3 and N4. Each of the pre-charge circuits PRE1 to PRE4 includes NMOS transistors N5 and N6.

A column decoder 18 decodes a column address CA to generate column selecting signals Y0 to Yn.

Each of local data IO line pairs LIO1P to LIO8P is arranged between the two adjacent memory cell array blocks, and current sense amplifier load circuits 14-1 to 14-9 are connected to the local data IO line pairs LIO1P to LIO8P, respectively.

The local data IO line pairs LIO12P and LIO78P are line pairs shared between the adjacent two memory cell array blocks. The local data IO line pairs LIO1P and LIO78P are connected to a data IO line pair DIO1P, and the local data IO line pairs LIO12P and LIO8P are connected to a data IO line pair DIO2P. The data IO line pairs DIO1P and DIO2P are connected to the current sense amplifiers 16-1 and 16-2, respectively.

Of all the cells in the array, FIG. 1 only shows the memory cells MC1 and MC1B, and MC2 and MC2B that are the farthest from the current sense amplifier 16-1 and 16-2, and also the memory cells MC3 and MC3B, and MC4 and MC4B that are the nearest to the current sense amplifier 16-1 and 16-2. It also shows a circuit configuration to input into and output from the memory cells MC1 and MC1B to MC4 and MC4B.

In FIG. 1, "SA" denotes a bit line sense amplifier, "CSAL" denotes a current sense amplifier load circuit, and "CSA" denotes a current sense amplifier.

A read operation of the semiconductor memory device of FIG. 1 is as follows: a pre-charge signal PRE is applied to pre-charge the bit line pairs BL1P to BL4P. An active command and a row address (not shown) are applied, so that the word line WL1 is enabled. When a bit line isolation signal ISO1 having a logic "high" level is generated, a data transmission is performed between the memory cells MC1 and MC1B, and MC2 and MC2B that are connected to the word line WL1 and the bit line pairs BL1P and BL2P. The bit line sense amplifiers 12-1 and 12-2 amplifies data of the bit line pairs BL1P and BL2P.

When a read command (not shown) and a column address CA is applied, the column decoder 18 generates the column selecting signal Y0 having a logic "high" level. So the data IO gates IOG1 and IOG2 are turned on to transfer data of the bit line pairs BL1P and BL2P to the local data IO line pairs LIO1P and LIO12P. The current sense amplifier load circuits 14-1 and 14-2 supply an electric current for the local data IO line pairs LIO1P and LIO2P and the data IO line pairs DIO1P and DIO2P. The current sense amplifiers 16-1 and 16-2 amplify a current difference between the data IO line pairs DIO1P and DIO2P to generate data D1 and D2.

In the semiconductor memory device of FIG. 1, data read from the memory cells MC1 and MC1B and MC2 and MC2B farthest from the current sense amplifiers 16-1 and 16-2 and differ in read speed the most from data read from the memory cells MC3 and MC3B and MC4 and MC4B nearest to the current sense amplifier 16-1 and 16-2. That is, a transmission speed of data read from the memory cells MC1 and MC1B and MC2 and MC2B farthest from the current sense amplifiers 16-1 and 16-2 is later than that of data read from the memory cells MC3 and MC3B and MC4 and MC4B nearest to the current sense amplifier 16-1 and 16-2. This is because a resistance value between the memory cells MC1 and MC1B and MC2 and MC2B and the current sense amplifiers 16-1 and 16-2 is larger than the memory cells MC3 and MC3B and MC4 and MC4B and the current sense amplifiers 16-1 and 16-2. This is due to the longer path.

FIG. 2 is a simplified circuit diagram illustrating a read operation modeling of the semiconductor memory device of FIG. 1. In FIG. 2, "Icell" denotes a memory cell current, and "Rload" denotes a resistor of a circuit that serves as a load during a data read operation, and "Vin" denotes an input voltage of the current sense amplifier, and "Rin" denotes an input impedance of the current sense amplifier, and "Iin" denotes an input current of the current sense amplifier.

As seen in FIG. 2, during a data read operation, the memory cell current Icell dividedly flows to the load resistor Rload and the input impedance Rin of the current sense amplifier.

The input current Iin is described as the following equation:

$$Iin = Rload/(Rload+Rin) \times Icell \qquad \text{(Equation 1)}$$

The input voltage is described as the following equation:

$$Vin = Iin \times Rin \qquad \text{(Equation 2)}$$

If a resistance value of the input impedance Rin of the current sense amplifier becomes very small or "0", all amount of the memory cell current Icell flows to the current sense amplifier. At this time, a resistance value of the input impedance, a voltage difference of the data IO line pair, becomes very small or "0".

The resistance value of the input impedance Rin depends on a distance from the current sense amplifier to the memory cell. The larger the distance from the current sense amplifier to the memory cell becomes, the larger the resistance value of the input impedance Rin becomes.

Therefore, the farther the memory cell is from the current sense amplifier, the later a data read speed of the memory cell becomes.

FIG. 3 is a circuit diagram illustrating the current sense amplifier of FIG. 1. The current sense amplifier includes PMOS transistors P1 and P2 and NMOS transistors N7 to N9.

A resistance value for the input impedance of the circuit of FIG. 3 is obtained as follows. Note that "Iin" denotes an input current that flows through the PMOS transistor P1, and "Vin" denotes an input voltage, and "gmp" denotes a mutual conductance between the PMOS transistors P1 and P2, and "gmn" denotes a mutual conductance between the NMOS transistors N7 and N8.

The input current Iin is described as the following equation:

$$Iin=(Vin-Vout) \times gmp \quad \text{(Equation 3)}$$

The output voltage is described as the following equation:

$$Vout = -1 \times (gmp/gmn)^2 \times Iin \quad \text{(Equation 4)}$$

Accordingly, a resistance value of the input impedance Rin is obtained by the following equation:

$$Rin = Vin/Iin = 1/gmp \times (1-(gmp/gmn)^2) \quad \text{(Equation 5)}$$

In Equation 5, "$(gmp/gmn)^2$" denotes a loop gain T.

In the current sense amplifier of FIG. 3, the input impedance Rin between the data IO line pair DIO and DIOB can have a very small resistance value, due to potential positive feed back of the current sense amplifier.

As can be seen in Equation 5, if the loop gain T of the current sense amplifier is "1", the input impedance Rin has a resistance value of "0". As a result, the voltage difference between the data IO line pair DIO and DIOB becomes "0", and the current sense amplifier amplifies a current difference between the data IO line pairs DIO and DIOB to generate the output voltage Vout. That is, the current sense amplifier operates ideally.

However, if the current sense amplifier is designed to have a loop gain T of more than "1", the input impedance Rin comes to have a negative resistance value. This results in an unstable system, and the output voltage Vout oscillates.

Conventionally, the current sense amplifier of the semiconductor memory device is designed for its input impedance to have a very small value so that it can best accommodate reading the farthest memory cells.

However, even though designed for the impedance to have a very small value, the current sense amplifier cannot be designed for the loop gain T to have a value of more than "1". That is, the current sense amplifier cannot be designed such that the mutual conductance gmp is larger than the mutual conductance gmn. Therefore, a problem exists, in that data of the memory cell farthest from the current sense amplifier are read with a delay.

Also, even though the current sense amplifier is designed for the loop gain T to have a value of less than "1", the input impedance Rin can have a negative value due to variations in conditions. Such conditions include process conditions, voltage and temperature variations, operation variations, etc. In this case, the output voltage oscillates, preventing the generation of stable read data.

SUMMARY OF THE INVENTION

To overcome the problems described above, the present invention provides a semiconductor memory device that can improve a data read speed difference between the memory cells.

A device according to the invention includes a plurality of memory cells and a current sense amplifier. It also includes a feedback circuit to adjust a gain of the current sense amplifier. The gain is adjusted depending on relative delays of data stored in different ones of the memory cells to be read on the current sense amplifier.

The present invention further provides a data read method of a semiconductor memory device including a plurality of memory cells. The method includes generating a control signal to control a loop gain of a plurality of current sense amplifiers by detecting a variation of an input impedance of the current sense amplifier when a read command is applied and data are read from the memory cell nearest to the plurality of the current sense amplifiers; controlling the loop gain of the plurality of the current sense amplifiers in response to the control signal; and amplifying a current different of each of a plurality of data IO line pairs by the plurality of the current sense amplifiers to generate a plurality of output signals.

The semiconductor memory device according to the present invention can set the loop gain of the current sense amplifier to be more than "1", and maintain the loop gain if the input impedance is positive. The semiconductor memory device can generate stable read data by reducing the loop gain when the data are read from the memory cells near to the current sense amplifier and when the input impedance becomes negative due to a process condition, voltage and temperature variation.

These and other features and advantages of the invention will be better understood from the following Detailed Description and attached Drawings, in which:

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Figure 4:
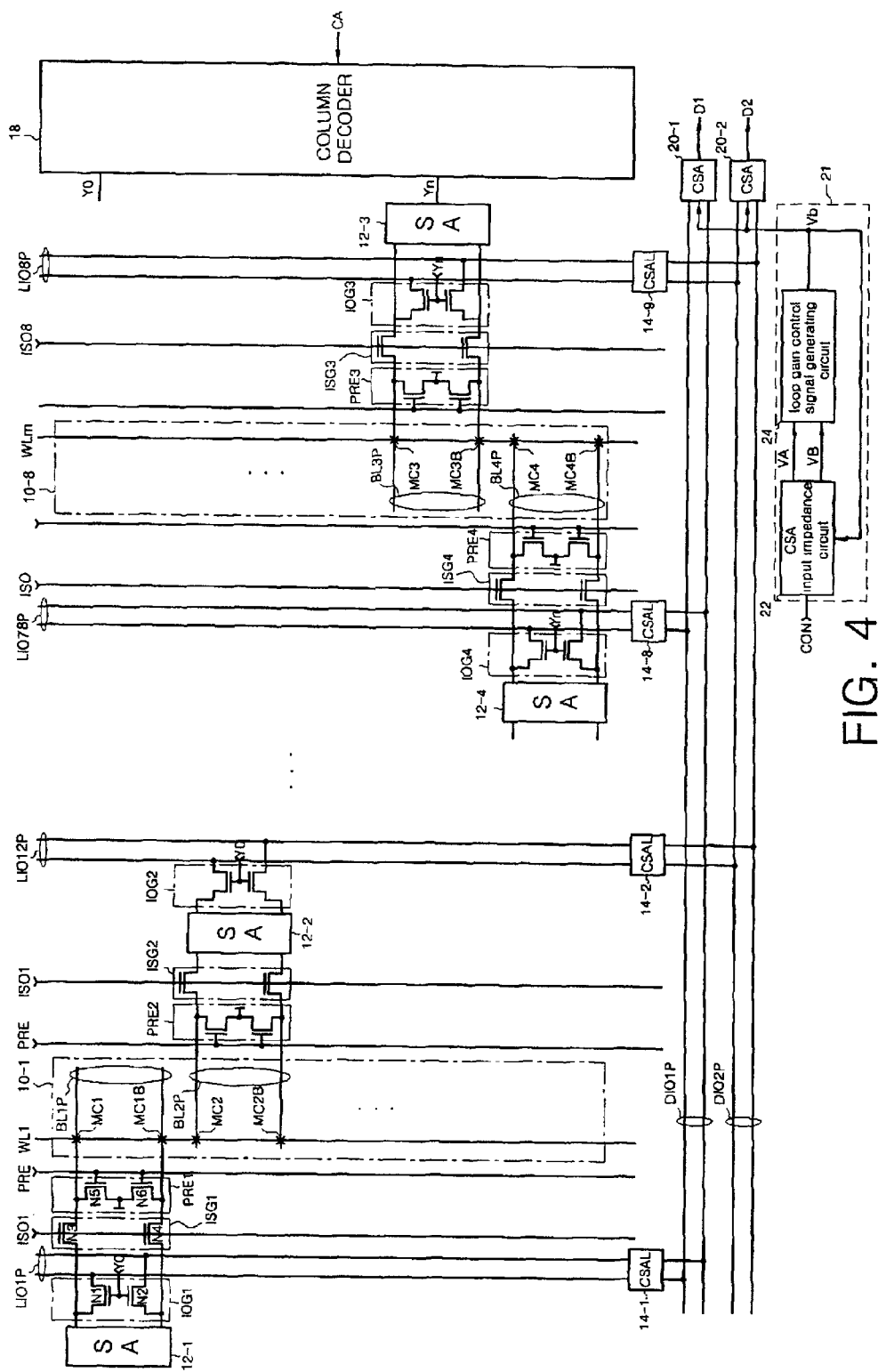
FIG. 4 is a block diagram illustrating a semiconductor memory device according to a preferred embodiment of the present invention.

Reference will now be made in detail to preferred embodiments of the present invention, example of which is illustrated in the accompanying drawings. FIG. 4 is a block diagram illustrating a semiconductor memory device according to a preferred embodiment of the present invention. Like reference numerals of FIGS. 1 and 4 denote like parts.

Figure 1:
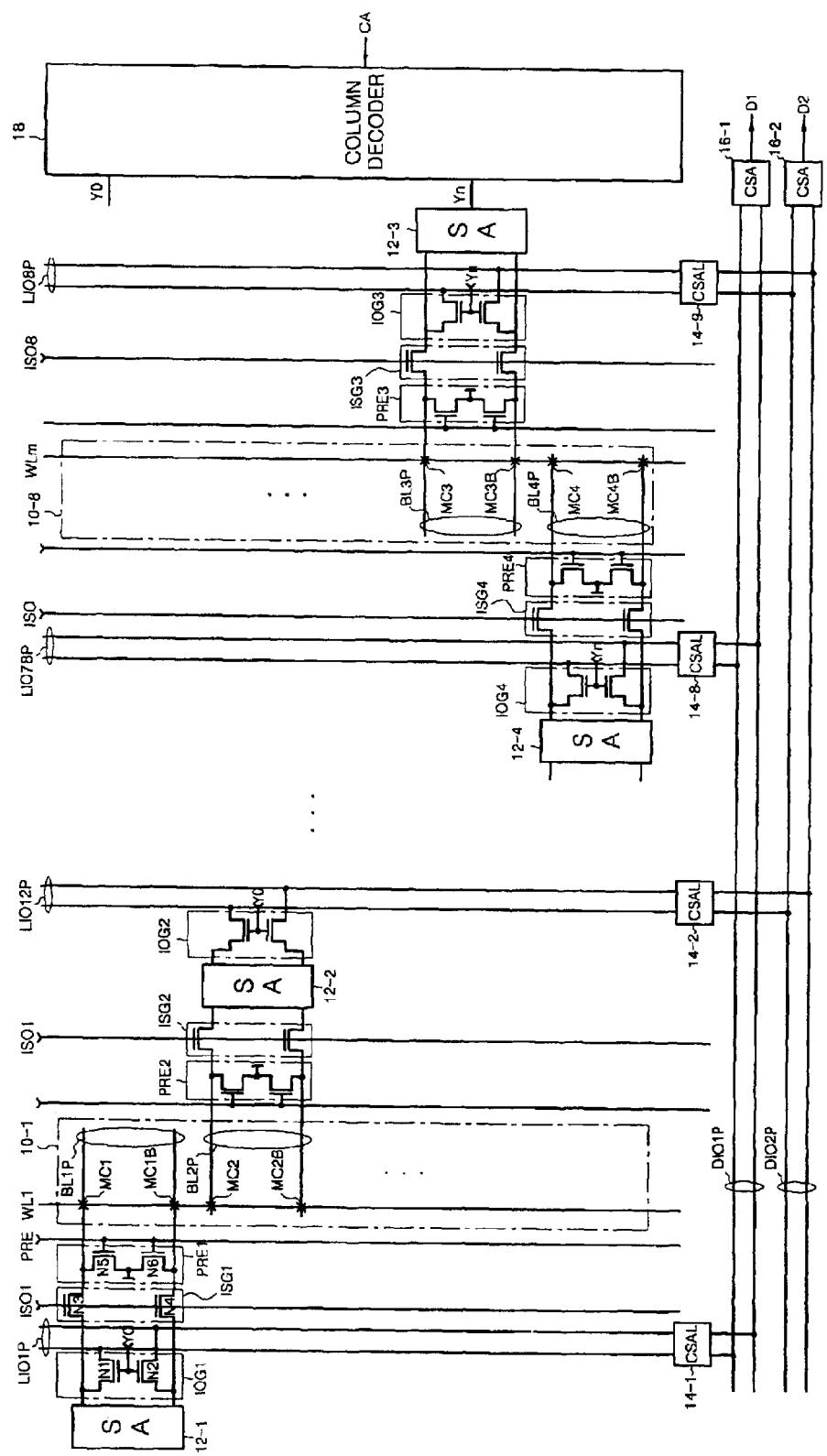
FIG. 1 is a block diagram illustrating a conventional semiconductor memory device.
Figure 2:
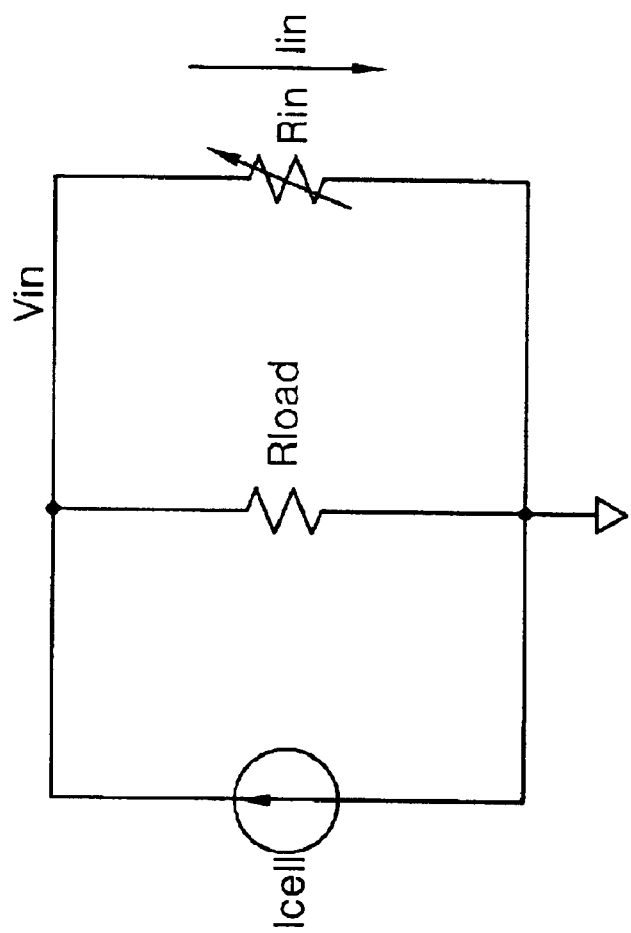
FIG. 2 is a simplified circuit diagram illustrating a read operation modeling of the semiconductor memory device of FIG. 1.

The semiconductor memory device of FIG. 4 has substantially the same configuration of the semiconductor memory device of FIG. 1, except that a number of elements are changed and added. These include current sense amplifiers 20-1 and 20-2 that are different from those of FIG. 1.

Importantly, a feedback circuit 21 is included to adjust a gain of the current sense amplifiers 20-1 and 20-2. The gain is adjusted depending on relative delays of data stored in different ones of the memory cells to be read on the current sense amplifier. Feedback circuit 21 outputs a bias voltage Vb in response to the determined delay. The current sense amplifiers 20-1, 20-1 receive the bias voltage Vb, and adjust accordingly their gain.

In the specific embodiment of FIG. 4, feedback circuit 21 includes an input impedance circuit 22, which is also known as a current sense amplifier input impedance circuit 22. Input impedance circuit 22 is adapted to generate intermediate output voltages VA, VB in response to the bias voltage Vb.

Feedback circuit 21 also includes a loop gain control signal generating circuit 24. Circuit 24 includes an amplifier AMP and a capacitor C. Amplifier AMP is also called a bias amplifier, and is adapted to generate the bias voltage in response to the intermediate output voltages.

The control signal CON is advantageously activated when a read command is applied. The current sense amplifier input impedance circuit 22 sets a state of an inner data pair in response to activating the control signal CON, and amplifies a current difference of the inner data pair to generate voltages VA and VB. The voltages VA and VB has a very small voltage difference therebetween.

The loop gain control signal generating circuit 24 amplifies a voltage difference between the voltages VA and VB to generate a bias voltage Vb. The bias voltage Vb is used to control a loop gain of the current sense amplifier input impedance circuit 22, and is also input in the current sense amplifiers 20-1 and 20-2.

That is, the current sense amplifier input impedance circuit 22 and the loop gain control signal generating circuit 24 detect whether the input impedance of the current sense amplifiers 20-1 and 20-2 is negative or not, and generate the bias voltage Vb accordingly.

Normally the input impedance is positive, in which case the loop gain is maintained "as is". If the input impedance becomes negative, the loop gain of the current sense amplifier input impedance circuit 22 and the loop gain control signal generating circuit 24 is controlled to reduce the loop gain.

Figure 5:
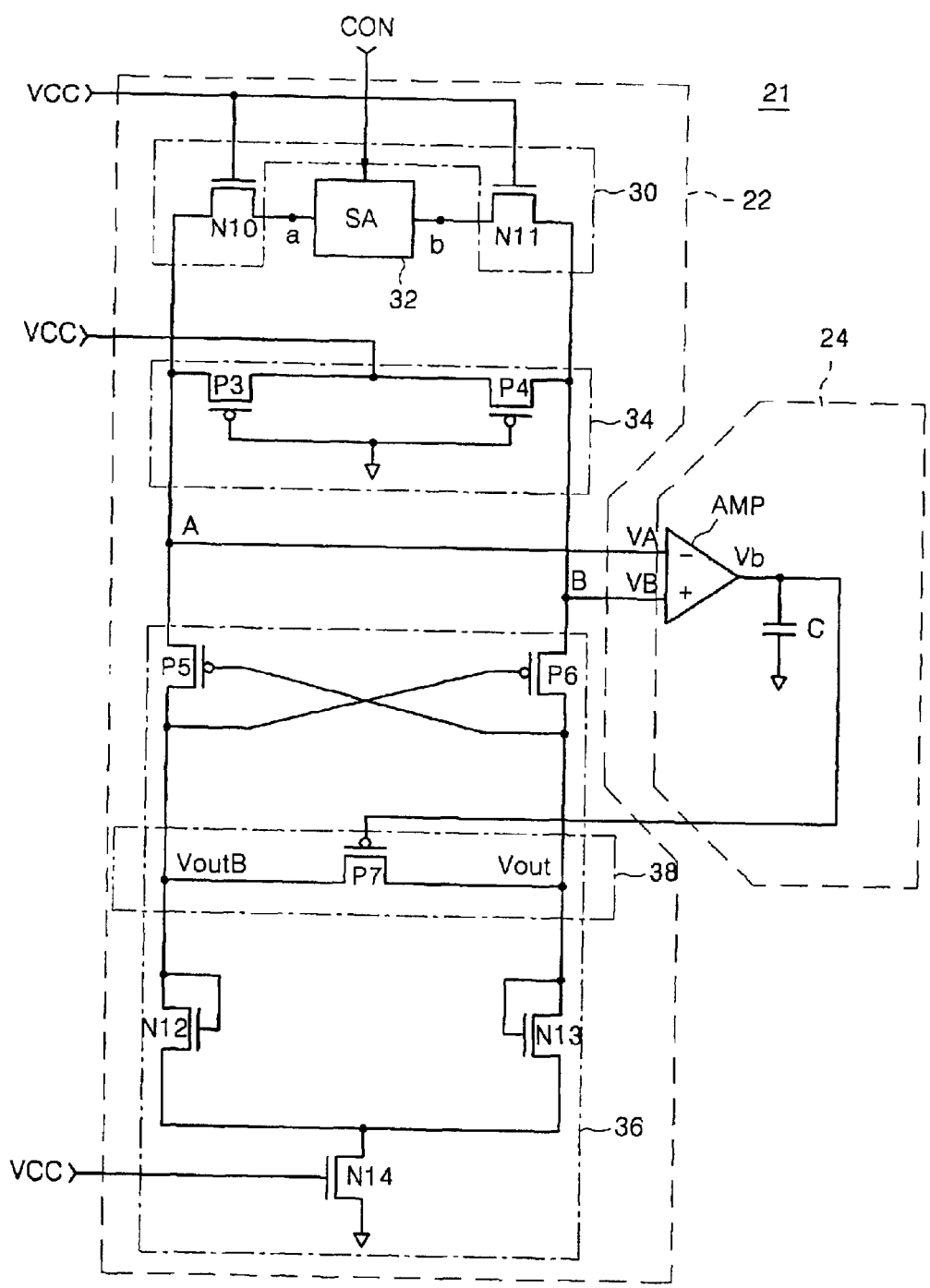
FIG. 5 is a circuit diagram illustrating a current sense amplifier input impedance circuit and a loop gain control signal generating circuit of FIG. 4.

FIG. 5 is a circuit diagram illustrating an embodiment of the feedback circuit 21 of FIG. 4. It will be appreciated that feedback circuit 21 includes a replica of one of the memory cells, which is hereby designated the reference memory cell. In addition, feedback circuit 21 is adapted to determine the delay of any one of the reference cells relative to an emulated delay of the reference memory cell.

The current sense amplifier input impedance circuit 22 includes a data IO gate 30 having NMOS transistors N10 and N11, a bit line sense amplifier 32, a current sense amplifier load circuit 34 having PMOS transistors P3 and P4, a current sense amplifier 36 having PMOS transistors P5 and P6 and NMOS transistors N12 to N14, and a loop gain control circuit 38 having a PMOS transistor P7.

In the preferred embodiment, the reference memory cell is that memory cell with the shortest data IO line pair. That is not necessary, however, and other equivalent designs may be made.

In the current sense amplifier input impedance circuit of FIG. 5, the memory cell closest to the CSA 20-1 is replicated, namely bit line pair BL4P. More particularly, data IO gate 30 is made similarly to the data IO gate IOG4. Bit line sense amplifier 32 is made similarly to the bit line sense amplifier 12-4. And the current sense amplifier load circuit 34 has the same configuration as the current sense amplifier load circuit 14-8. Also, a line length among the circuits 30, 32 and 34 is preferably made equal to that among the circuits IOG4, 12-4 and 14-8.

An operation of the current sense amplifier input impedance circuit of FIG. 5 is as follows.

When a power voltage VCC is applied to gates of the NMOS transistors N10 and N11, sources of the PMOS transistors P3 and P4 and a gate of the NMOS transistor N14, an operation of the circuits 30, 34 and 36 is enabled.

Also, when a read command is applied, in response to the control signal CON, voltages of nodes "a" and "b" of the bit line sense amplifier 32 are set to a logic "low" level and a logic "high" level, respectively, or logic "low" level and a logic "high" level. The invention works either way. Both cases are discussed below.

First, assume that the voltages of the nodes "a" and "b" are, respectively, set to a logic "low" level and a logic "high" level, a large amount of current flows to the node "a" from the PMOS transistor P3, and a small amount of current flow to the node "b" from the PMOS transistor P4. As a result, a small amount of current flows to a node "A", and a large amount of current flows to a node "B". The voltages VA and VB, respectively, at the nodes "A" and "B" have a very small voltage difference therebetween.

The current sense amplifier 36 outputs an output voltage Vout and a complementary output voltage VoutB. These voltages Vout, VoutB are not really output from the circuit, other than being compared through P7. It will be appreciated that Vout, VoutB are emulated values of the output voltage Vout of CSA 20-1. They assist circuit 22 in estimating the differential delays from the differential input impedance.

The current sense amplifier 36 amplifies a difference between currents that flow to the node "A" and "B", so that a level of an output voltage Vout becomes higher than that of an inverted output voltage VoutB. VB at the node "B" becomes higher in level than VA at the node "A".

However, when data are read from the memory cells near to the current sense amplifier 20-1, or when a mutual conductance between the PMOS transistors P5 and P6 and the NMOS transistors N12 and N13 varies due to a process condition, voltage and temperature variation, the output voltage Vout becomes lower in level than the inverted output voltage VoutB. VA at node "A" becomes higher than VB at the node "B". That is, the input impedance becomes negative.

The amplifier AMP raises the bias voltage Vb higher when the voltage VA is lower in level than the voltage VB, and lowers the bias voltage Vb lower when the voltage VA is higher in level than the voltage VB. The capacitor C removes a high frequency element from the bias voltage Vb.

When the bias voltage Vb is higher in level than the output voltage Vout, the PMOS transistor P7 is turned off, to maintain a level of the output voltage Vout and the inverted output voltage VoutB "as is". When the bias voltage Vb is lower in level than the output voltage Vout, the PMOS transistor P7 is turned on to reduce a level difference between the output voltage Vout and the inverted output voltage VoutB. A reduction of the level difference between the output voltage Vout and the inverted output voltage VoutB leads to a reduction of the loop gain. At this time, the bias voltage Vb is also applied to the current sense amplifiers 20-1 and 20-2 to control the loop gain of the current sense amplifiers 20-1 and 20-2.

Conversely, it is now assumed that the voltages at the nodes "a" and "b" are set to a logic "high" level and a logic "low" level, respectively. If the voltage VA at the node "A" is higher than the voltage VB at the node "B", the input impedance is positive, and if the voltage VA at the node "A"

is lower than the voltage VB at the node "B", the input impedance is negative.

The amplifier AMP raises the bias voltage Vb higher when the voltage VA is lower in level than the voltage VB, and lowers the bias voltage Vb when the voltage VA is higher in level than the voltage VB. When the bias voltage Vb is lower in level than the output voltage Vout, the PMOS transistor P7 is turned on, to reduce a level difference between the output voltage Vout and the inverted output voltage VoutB.

Figure 3:
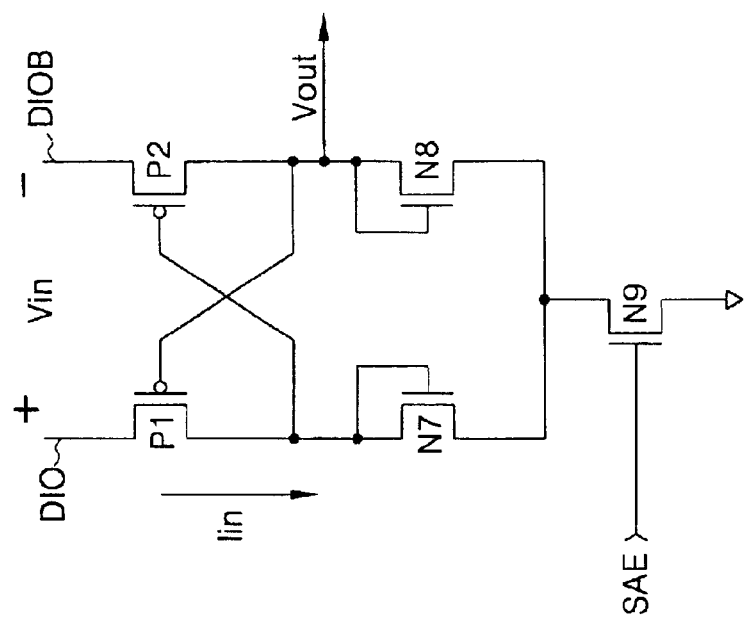
FIG. 3 is a circuit diagram illustrating a current sense amplifier of FIG. 1.
Figure 6:
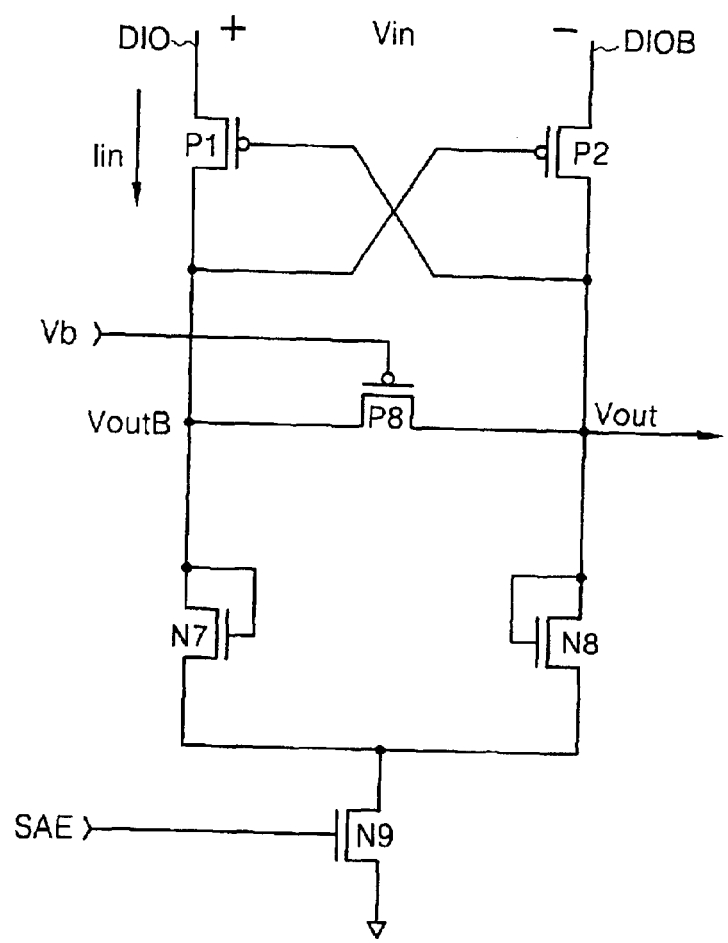
FIG. 6 is a circuit diagram illustrating a current sense amplifier of the semiconductor memory device according to the preferred embodiment of the present invention.

FIG. 6 is a circuit diagram illustrating an embodiment of the current sense amplifier 20-1 of the semiconductor memory device according to the preferred embodiment of the present invention. The current sense amplifier of FIGS. 3 and 6 has the same configuration except an addition of a loop gain control circuit. The loop gain control circuit includes a PMOS transistor P8. Like reference numerals of FIGS. 3 and 6 denote like parts.

An operation of the current sense amplifier of FIG. 6 is as follows. When the bias voltage Vb is higher in level than the output voltage Vout, the PMOS transistor P8 is turned off, to maintain a level of the output voltage Vout and the inverted output voltage VoutB "as is". On the other hands, when the bias voltage Vb is lower in level than the output voltage Vout, the PMOS transistor P8 is turned on, to reduce a level difference between the output voltage Vout and the inverted output voltage VoutB. That is, when a negative input impedance is generated, the PMOS transistor P8 is turned on to reduce a level difference between output voltage Vout and the inverted output voltage VoutB. This, in turn reduces the loop gain.

The current sense amplifier of the semiconductor memory device according to the present invention can be designed so that the mutual conductance gmp between the PMOS transistors P1 and P2 is larger than the mutual conductance gmn between the NMOS transistors N7 and N8.

As a result, when data are read from the memory cells far from the current sense amplifier, a data read speed becomes faster. Also, when data are read from the memory cells near to the current sense amplifier, if the input impedance is negative, the PMOS transistor P8 is turned on to reduce the loop gain, so that the output voltage Vout is not oscillated, leading to a stable output voltage Vout.

The loop gain control circuit described above includes the PMOS transistor and may include an NMOS transistor other than the PMOS transistor. When the loop gain control circuit includes the NMOS transistor, plus and minus signs of the amplifiers are equivalently changed in location accordingly.

Figure 7:
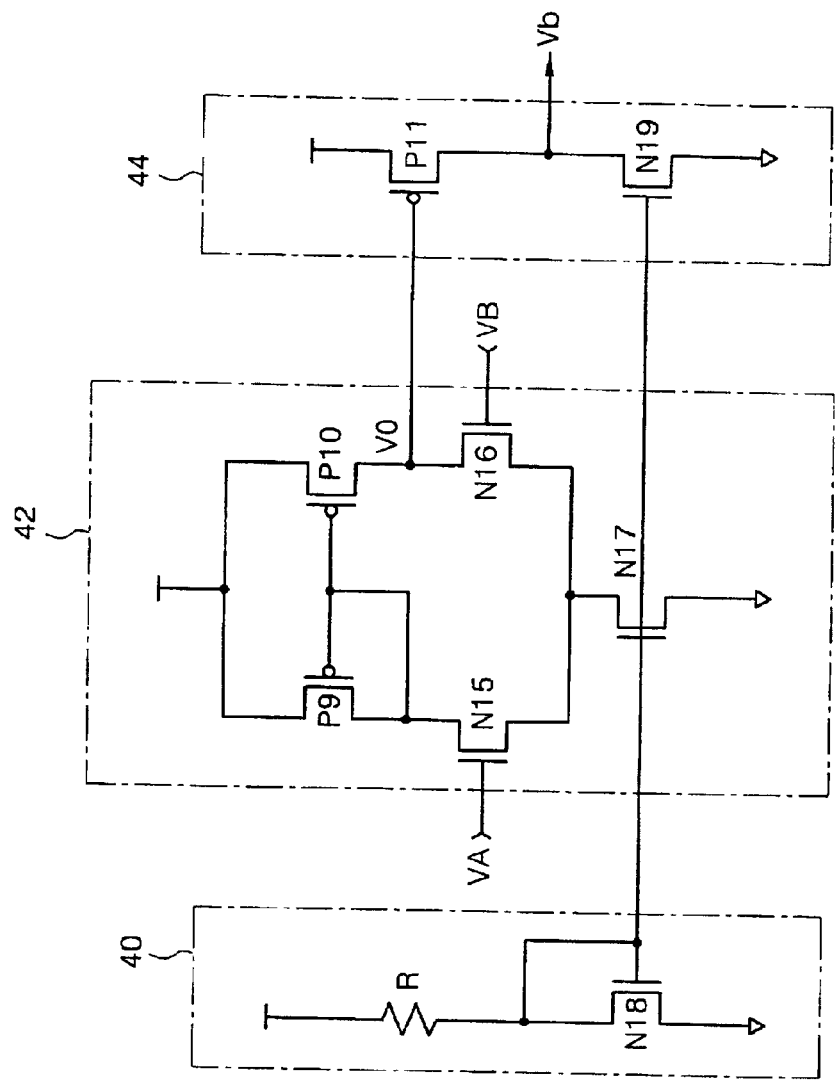
FIG. 7 is a circuit diagram illustrating an amplifier of FIG. 5.

FIG. 7 is a circuit diagram illustrating an embodiment of the amplifier AMP of FIG. 5. The amplifier includes a bias circuit 40 having a resistor R and an NMOS transistor N18, a differential amplifier 42 having PMOS transistors P9 and P10 and NMOS transistors N15 to N17, and an output driving circuit 44 having a PMOS transistor P11 and an NMOS transistor N19.

An operation of the amplifier AMP of FIG. 7 is as follows. When a power voltage VCC is applied, the NMOS transistors N17 to N19 are turned on. When the voltage VA is higher in level than the voltage VB and thus the PMOS transistor P11 is turned off, the differential amplifier 42 raises a level of an output voltage Vo up. Conversely, when the voltage VA is lower in level than the voltage VB and thus the NMOS transistor N15 is turned on more in turn-on degree than the NMOS transistor N16, the differential amplifier lowers a level of the output voltage Vo down. Therefore, the PMOS transistor P11 is turned on to raise a level of the bias voltage Vb up.

Figure 8:
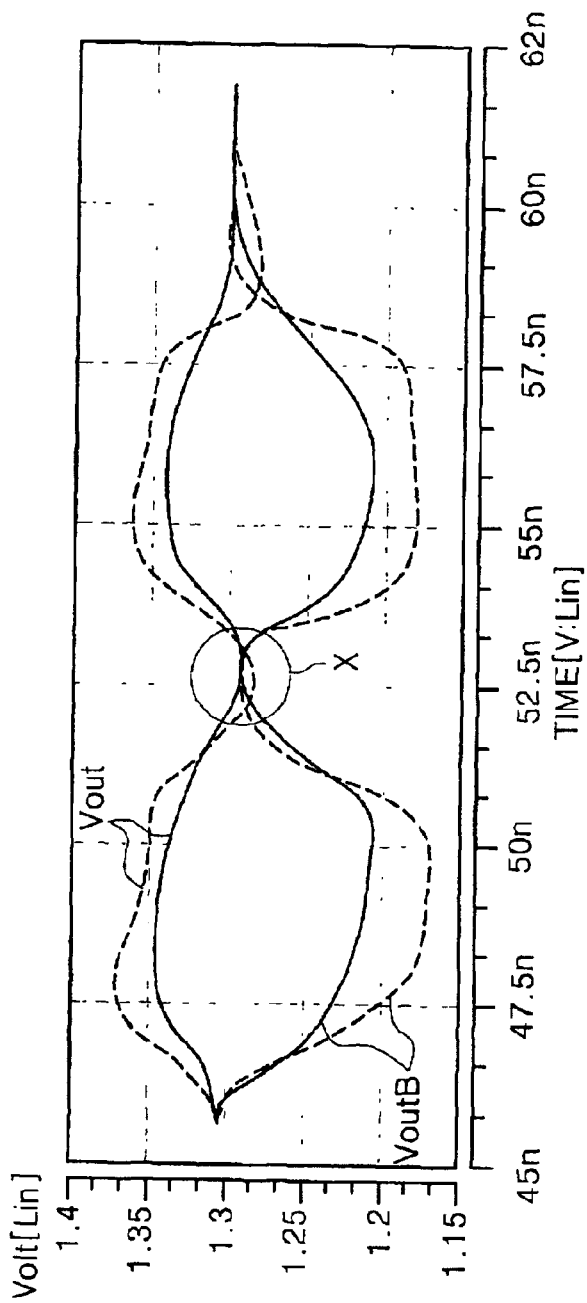
FIG. 8 is a graph simulating an operation of a current sense amplifier in the prior art (dashed line) and according to the present invention (solid line).

FIG. 8 is a graph simulating an operation of the current sense amplifier, respectively, according to the conventional art and the present invention. In order to simulate an operation of the current sense amplifier, the mutual conductance between the PMOS transistors of the current sense amplifier is set to be relatively large, and the mutual conductance between the NMOS transistors is set to be relatively small.

In the graph of FIG. 8, a dashed line denotes the output voltage Vout and the inverted output voltage VoutB of the current sense amplifier according to the conventional art, and a solid line denotes the output voltage Vout and the inverted output voltage VoutB of the current sense amplifier according to the present invention.

In the current sense amplifier according to the conventional art, when the input impedance is negative, a voltage difference between the output voltage Vout and the inverted output voltage VoutB is relatively large, and the output voltage Vout and the inverted output voltage VoutB change places at a portion indicated as "X".

However, in the current sense amplifier according to the present invention, when the input impedance is negative, a voltage difference between the output voltage Vout and the inverted output voltage VoutB is relatively small, the output voltage Vout and the inverted output voltage VoutB do not change places at the portion "X".

As described herein before, since the semiconductor memory device according to the present invention can be designed so that the mutual conductance between the PMOS transistors of the current sense amplifier may be larger than the mutual conductance between the NMOS transistors, data read from the memory cells far from the current sense amplifier can fast be transferred. Also, the semiconductor memory device according to the present invention can generate stable read data by reducing the loop gain when the input impedance of the current sense amplifier is negative.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor memory device, comprising:
   a plurality of memory cells;
   a current sense amplifier; and
   a feedback circuit to adjust a gain of the current sense amplifier depending on relative delays of data stored in different ones of the memory cells to be read on the current sense amplifier.

2. The device of claim 1, in which the feedback circuit includes a replica of a reference one of the memory cells, and
   is adapted to determine the delay of any one of the reference cells relative to an emulated delay of the reference memory cell.

3. The device of claim 2, in which each of the memory cells is connected to the amplifier through a data IO line pair, and the reference memory cell is the one with the shortest data IO line pair.

4. The device of claim 2, in which the feedback circuit outputs a bias voltage determined by the determined delay, and the current sense amplifier receives the bias voltage and adjust accordingly the gain.

5. The device of claim 4, in which the feedback circuit includes
   an input impedance circuit to generate intermediate output voltages in response to the bias voltage, and
   a bias amplifier to generate the bias voltage in response to the intermediate output voltages.

6. A semiconductor memory device, comprising:

a plurality of memory cells;

a plurality of data IO line pairs;

a plurality of first current sense amplifying means configured to control a loop gain in response to a control signal, and configured to amplify and output a current difference of each of the plurality of data IO line pairs; and a feedback circuit configured to adjust a gain of the first current sense amplifiers depending on a relative delay of data stored in different ones of the memory cells that are to be read by the first current sense amplifiers.

7. The device of claim 6, wherein the feedback circuit comprises:

a current sense amplifier input impedance circuit and a loop gain control signal detecting circuit configured to detect an input impedance of the plurality of first current sense amplifiers and to generate a control signal when a read command is applied.

8. The device of claim 7, wherein the feedback circuit further comprises:

a current sense amplifier input impedance detecting circuit configured to generate a detecting voltage to detect the input impedance of the plurality of the first sense amplifiers when the read command is applied; and a loop gain control signal generating circuit configured to receive the detecting voltage to generate the control signal to indicate whether the input impedance is negative or positive.

9. The device of claim 8, wherein the current sense amplifier input impedance detecting circuit comprises:

a bit line sense amplifier configured to amplify data applied in response to the read command;

a data IO gate configured to transfer data of the bit line sense amplifier to the data line pair in response to the read command;

a current sense amplifier load circuit configured to apply an electric current to the data line pair in response to the read command; and a second sense amplifier configured to control a loop gain in response to the control signal and configured to amplify a current difference of the data line pair to generate an output voltage and an inverted output voltage, wherein the bit line sense amplifier, the data IO gate, and the current sense amplifier load circuit are configured to have a line load capacitance of from, among the plurality of memory cells, the memory cell nearest to the first current sense amplifier to the plurality of first current sense amplifiers.

10. The device of claim 9, wherein the second current sense amplifier comprises:

a second current sense amplifier configured to amplify a current difference of the data line pair to generate the output voltage and the inverted output voltage;

a second loop gain control circuit connected between the output voltage and the inverted output voltage of the second current sense amplifier, configured to reduce a voltage difference between the output voltage and the inverted output voltage in response to the control signal when the input resistance is negative, and configured to maintain a voltage between the output voltage and the inverted output voltage "as is" in response to the control signal when the input impedance is positive.

11. The device of claim 10, wherein the second loop gain control means comprises a second PMOS transistor.

12. The device of claim 10, wherein the loop gain control signal generating circuit receives data of the data line pair of the current sense amplifier input impedance detecting circuit as the detecting voltage, lowers a level of the control signal down when the input impedance of the current sense amplifier is negative, and raises the level of the control signal when the input impedance is positive.

13. The device of claim 12, wherein the loop gain control signal generating circuit comprises:

a bias circuit configured to generate a bias voltage when a power voltage is applied;

a differential amplifier that is enabled when the bias voltage is applied, and is configured to amplify a difference of the detecting voltage to generate the output voltage; and an output driving circuit configured to generate the control signal in response to the bias voltage and and configured to raise a level of the control signal in response to the output voltage.

14. The device of claim 7, wherein each of the plurality of first current sense amplifiers comprises:

a first current sense amplifier configured to amplify a current difference of the data IO line pair to generate an output voltage and an inverted output voltage; and a first loop gain control circuit connected between the output voltage and the inverted output voltage of the first current sense amplifier, configured to reduce a voltage difference between the output voltage and the inverted output voltage in response to the control signal when the input resistance is negative, and confirmed to maintain a voltage between the output voltage and the inverted output voltage "as is" in response to the control signal when the input impedance is positive.

15. The device of claim 14, wherein the first loop gain control circuit comprises a first PMOS transistor.

16. A data read method of a semiconductor memory device including a plurality of memory cells, the method comprising:

generating a control signal to control a loop gain of a plurality of current sense amplifiers by detecting a variation of an input impedance of the current sense amplifier when a read command is applied and data are read from the memory cell nearest to the plurality of the current sense amplifiers;

controlling the loop gain of the plurality of the current sense amplifiers in response to the control signal; and amplifying a current different of each of a plurality of data IO line pairs by the plurality of the current sense amplifiers to generate a plurality of output signals.

* * * * *

UNITED STATES PATENT AND TRADEMARK OFFICE
CERTIFICATE OF CORRECTION

PATENT NO. : 6,721,218 B2
DATED : April 13, 2004
INVENTOR(S) : Lim

It is certified that error appears in the above-identified patent and that said Letters Patent is hereby corrected as shown below:

Column 10,
Line 39, "and confirmed to" should read -- and configured to --.

Signed and Sealed this

Eighth Day of February, 2005

JON W. DUDAS
*Director of the United States Patent and Trademark Office*